United States Patent [19]

Altoz

[11] Patent Number: 5,325,913
[45] Date of Patent: Jul. 5, 1994

[54] MODULE COOLING SYSTEM

[75] Inventor: Frank E. Altoz, Baltimore, Md.

[73] Assignee: The United States of America as represented by the Secretary of the Navy, Washington, D.C.

[21] Appl. No.: 81,712

[22] Filed: Jun. 25, 1993

[51] Int. Cl.$^5$ .................................................. F28D 15/02
[52] U.S. Cl. ........................................ 165/32; 165/41; 165/911; 361/700
[58] Field of Search ................. 165/104.33, 32, 911, 165/41; 361/700

[56] References Cited

U.S. PATENT DOCUMENTS

| | | | |
|---|---|---|---|
| 2,472,717 | 6/1949 | Morey | 165/104.21 |
| 2,643,282 | 6/1953 | Greene | 165/104.33 |
| 2,683,823 | 7/1954 | Cunningham et al. | 165/104.33 |
| 3,560,778 | 2/1971 | Raye | 165/32 |
| 3,968,787 | 7/1976 | Basiulis | 165/104.26 |
| 4,012,770 | 3/1977 | Pravada et al. | 357/82 |
| 4,219,070 | 8/1980 | Kurokowa et al. | 165/11 R |
| 4,306,613 | 12/1981 | Christopher | 165/32 |
| 4,327,399 | 4/1982 | Sasaki et al. | 361/385 |
| 4,377,198 | 3/1983 | Welling et al. | 165/32 |
| 4,582,121 | 4/1986 | Casey | 165/1 |
| 4,635,709 | 1/1987 | Altoz | 165/32 |
| 4,727,455 | 2/1988 | Neidig et al. | 361/385 |
| 4,880,053 | 11/1989 | Vladimir | 165/104.26 |
| 5,161,090 | 11/1992 | Crawford et al. | 361/385 |

Primary Examiner—Albert W. Davis, Jr.
Attorney, Agent, or Firm—Paul I. Kravetz; Harry E. Barlow; John L. Forrest, Jr.

[57] ABSTRACT

An apparatus is provided for cooling electronic components mounted on a circuit board. The circuit board is placed in thermal contact with a heat sink enclosure that has an interior cavity and a release opening that provides a path from the interior cavity to the external ambient. A meltable pellet blocks the release opening. A wick is bonded to the inside surface of the interior cavity. The device is sealed with a working fluid that permeates the wick. When the components get hot, the heat is transferred through the heat sink enclosure to the working fluid in the wick, causing the working fluid to vaporize. The vapors remain trapped in the interior cavity until the pellet melts, allowing the vapor to be released and the temperature of the heat sink enclosure to be stabilized or lowered.

20 Claims, 1 Drawing Sheet

MODULE COOLING SYSTEM

BACKGROUND OF THE INVENTION

FIELD OF THE INVENTION

This invention relates to cooling systems, more particularly to cooling system for cooling electronic components.

DESCRIPTION OF THE RELATED ART

Many cooling systems for electronic components, such as those systems used to cool electronic components in missiles, have proven to be inadequate due to the extremely high temperatures which the electronic components are exposed. With a missile, the skin or surface of the missile can reach extremely high temperatures during flight, in some cases exceeding 1000° F. Packaged within the missile cylinder are electronic components which must operate prior to and during the launch and flight phase of the missile. The temperature of an electronic component prior to launch is estimated to be as high as 85° C. (185° F.). This temperature build-up prior to launch can be caused by many factors, such as the outside ambient temperature and the heat generated by the component itself or by other components in the missile. Also, during carriage-flight (that is, when a missile is being carried by an aircraft prior to launch from the aircraft) heat is built-up from the air friction. Whatever the source, the increase in temperature is a severe problem because the maximum junction temperature for a typical electronic component after launch should not exceed 100° C. to 110° C. Therefore, with an estimated prior-launch electronic component temperature of 85° C. only a 15° C. to 25° C. rise in temperature is allowed during the flight period.

Another problem that is particularly important with missile systems and other flying devices is that the electronic component cooling system should be as light weight and compact as possible. Bulky, heavy cooling systems that use large reservoirs, heat pipes, motors or condensers may not be acceptable.

Methods to keep the electronic components cool include the use of insulation to keep the skin heat from entering the interior and system mass storage. Such methods include the use of aluminum in the missile assemblies. Unfortunately, capacitance or mass x specific heat from metal is inefficient for heat storage and results in a weight penalty which affects the flight performance of the missile.

To a somewhat lesser degree, phase change material which melts at a prescribed temperature can be made to absorb the heat, but this method is also inefficient and has poor heat conductivity.

Other cooling systems tend to be closed systems where a phase change material is "recycled" from phase to phase, such as with a heat pipe. These systems tend to be relatively heavy.

SUMMARY OF THE INVENTION

Accordingly, one object of the present invention is to provide an effective cooling system for electronic components, especially for electronic components used on missiles.

A further object of the present invention is to provide a cooling system which is lighter in weight than conventional systems and therefore introduces a reduced weight penalty.

An advantage of the present invention is to utilize an open system for release of heat transferred from the electronic components.

A further advantage of the present invention is to utilize heat transfer/wick technology.

A further advantage of the present invention is to utilize a pellet device for vapor release.

A further advantage of the present invention is to protect the upper temperature limit of an electronic module located within a missile, wherein such protection arises through the use of the latent heat of evaporation using water or most any other suitable coolant which is compatible with the structural materials of the module.

An electronic component mounted on a circuit board is placed in thermal contact with a heat sink enclosure having an interior cavity and a release opening. A wick is bonded to the inside surface of the cavity of the enclosure. A plug is retained in the release opening. The plug has a passage which provides a path from the cavity of the enclosure to the outside ambient or an external storage device. A meltable pellet is inserted into the passage of the plug and blocks the passage. A working fluid is sealed inside the cavity of the enclosure and permeates the wick. When the pellet melts, a vapor of the working fluid travels through the passage in the plug, thereby cooling the enclosure by release of the vapor.

BRIEF DESCRIPTION OF THE DRAWINGS

A more complete appreciation of the present invention and many of the attendant advantages thereof will be readily obtained as the same becomes better understood by reference to the following detailed description When considered in connection with the accompanying drawings, wherein.

DESCRIPTION OF THE PREFERRED EMBODIMENT

Figure 1:
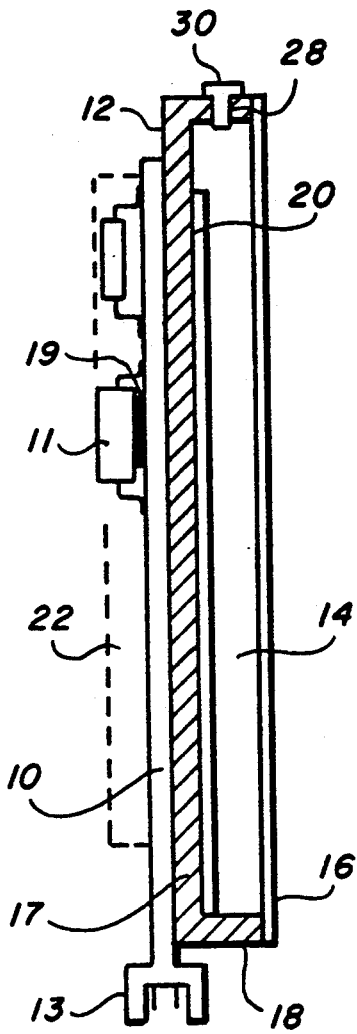
FIG. 1 shows a side view of a module cooling system of the subject invention.

Referring now to the drawings, wherein like reference numerals designate identical or corresponding parts throughout the several views, and more particularly in FIG. 1 a circuit board 10, usually a printed circuit board, containing electronic components 11 mounted on the circuit board 10, is shown bonded in thermal contact to a metal heat sink plate 12. The circuit board 10 usually has a connector 13 for interfacing the circuit board 10 to other hardware (not illustrated). While there are many ways to bond the circuit board 10 to the heat sink plate 12 which are known in the art, a method should be selected that will provide efficient thermal transfer from the circuit board 10 to the heat sink plate 12. In a missile, the circuit board 10 should preferably be made to conform to the inside diameter of the missile cylinder in order to maximize the area for mounting components. The heat sink plate 12 should be made of a metal, such as copper. The heat sink plate 12 is shaped so as to form a cavity 14 when sealed with a cover 16. The connection of the cover 16 to the heat sink plate 12 should be done with a braze seal to ensure that there is no leak. The heat sink plate has a long flat portion 17 that corresponds to the shape and size of the circuit board 10, and protruding side members 18 on all sides, to form what could be described as a "box without a lid." The cover 16 acts as a lid to the box. The cover 16 should be made of a material that is compatible with the heat sink plate so as to provide good conductivity. For example, the cover should be made of copper if the heat sink plate 12 is made of copper. The size and shape of the heat sink plate 12 and cover 16 will depend on factors such as the size and shape of the circuit board 10. The combination of the heat sink plate 12 and the cover 16 can be described as a heat sink enclosure. The entire enclosure acts as a heat sink. The enclosure could be described as having an interior cavity and can be thought of as shaped like a closed, empty box.

An adhesive 19 should be used attach the electronic component 11 to the circuit board 10 to provide for efficient heat transfer from the electronic component 11 to the circuit board 10. Similarly, VIAs (not illustrated) or conducting elements (not illustrated) located under the electronic components 11 could be used to provide an efficient heat path through the circuit board 10 to the heat sink plate 12.

A wick 20 is attached to the heat sink plate 12 so that the wick 20 will reside inside the cavity 14. The wick 20 is a wire screen mesh made of a porous metal that will absorb liquid. Such wicks are well-known in the art. The wick 20 is attached to the surface of the heat sink plate 12 through a conventional diffusion bonding process used in heat pipe manufacturing which is also well known in the art. When the cover 16 is connected to the heat sink plate 12, the wick 20 will reside inside the cavity 14 formed by the heat sink plate 12 and cover 16. The cavity 14 is evacuated, such as is done with a typical heat pipe, and the wick 20 is back filled with a working fluid (not illustrated) and the module is then pinched off or sealed. The process of evacuating the cavity 14, back filling the wick 20 and pinching off or sealing the module is common with heat pipes and well-known in the heat pipe art. The wick 20 holds the working fluid by capillary action and is adjacent to the component area 22 so that the heat flows directly from the electronic component into the working fluid through the heat sink plate 12. When the working fluid in the wick 20 reaches its vaporization temperature, it evaporates. The resulting vapor will be trapped inside the cavity 14. To be most effective, the wick 20 must be placed in close proximity to the electronic component heat source so that only a small temperature gradient results from the electronic component 11 to the working fluid. For best results, this temperature gradient should be limited to less than 5° C.

The working fluid should be a material that can phase change from a liquid to a vapor at some temperature below the upper limit temperature of electronic components 11 on the circuit board 10. The type of working fluid used to fill the wick must be compatible with the materials of the heat sink plate 12 and the cover 16 to prevent any corrosion. However, selecting the working fluid proves to be no burden and compatibility is easily achieved by a person skilled in the art. For example, where the heat sink plate 12 and cover 16 are made of monel or copper, the working fluid can be distilled water. Water is an especially good working fluid to use since it has a relatively high heat of vaporization, approximately 950 to 1000 Btu/lb depending on pressure. Where the heat sink plate 12 and cover 16 are stainless steel, the working fluid could be methanol or ammonia. There are also many other possible combinations.

Figure 2:
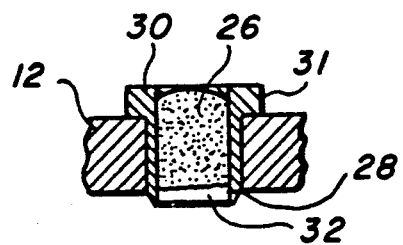
FIG. 2 shows an enhanced view of the plug-pellet assembly used in conjunction with the module cooling system shown in FIG. 1.

Referring to both FIG. 1 and FIG. 2, the heat sink plate includes a release opening 28 which, when unblocked, allows an unobstructed path from the cavity 14 to an area external to the invention to allow vapor (not illustrated) inside the cavity 14 to escape. A plug 30 is used to fill the opening and should be properly bonded or press-fit into the heat sink plate 12 to provide an effective seal with good heat conductivity. The plug 30 should be made of a metal that is compatible with the material of the heat sink plate 12 and cover 16 to ensure good heat conductivity. For example, if the heat sink plate 12 and cover 16 are made of copper, then the plug 30 should also be made of copper. The plug 30 is cylindrically shaped and has an upper rim 31 extending outward to prevent the plug 30 from being pushed too far into the cavity 14. The plug 30 has a passage 32 which extends completely through the plug 30 from top to bottom. A pellet 26 is inserted in the passage 32 and should completely block the passage 32. The initial insertion of the pellet 26 into the plug 30 should be done by melting the material into the passage 32. The plug 30, pellet 26 and passage 32 in the plug 30 are designed so that the plug 30 and pellet 26 completely block the release opening 28 and keep vapor trapped inside. Pellet 26 is formed from a material which melts at a certain temperature to provide a path for the vapor inside the cavity 14 to escape to the external ambient or to some storage device (not illustrated) external to the invention. The size of the passage 32 in the plug 30 should be large enough to allow the vapor inside the cavity 14 to be released, thereby maintaining a low pressure inside the cavity 14. Ideally, this pressure should be less than the sea level pressure, or less than 1 psi above the pressure of the ambient surrounding the invention. If the passage 32 in the plug 30 is not large enough, then the vapor will not be released quickly enough from the cavity 14 and the temperature of the electronic component 11 may rise above the desired temperature. This invention could also be made without the plug 30 where the release opening 28 is simply plugged with a pellet 26. The plug 30 is mainly needed for ease and efficiency in blocking the release opening 28.

During carriage flight, the heat sink plate 12 reaches a maximum steady state temperature based on the aircraft speed-altitude profile, near 85° C. in a "worst case" scenario. While the heat sink plate 12 is near or below this temperature, the heat should be transferred to the missile skin (not illustrated) by means of a suitable interface connection (not illustrated). Methods of transferring heat to the missile skin are well-known in the art.

However, the temperature of the heat sink plate 12 may rise above the steady state temperature, especially after launch. When the heat sink plate 12 reaches a temperature above the steady state temperature, the added rise in temperature causes a melting to occur within the pellet 26. The pellet 26 should be selected to be made from a material that melts at a specified temperature above the approximate maximum steady state temperature but at or below the upper limit temperature of the electronic component. When melting of the pellet 26 occurs, the melted pellet material will cease to block the passage 32 in the plug 30 and a path will be created between the cavity 14 and the external ambient. This path allows a release of the vapor from the cavity 14. The process then continues until the entire working fluid is used up. The amount of working fluid used should be enough to last the entire missile flight time.

The vapor is released into the interior of the missile. However, the vapor could also be routed through tubing for release outside the missile, into a storage device external to the invention, or simply away from the interior compartment of the missile. With a short flight time and a component with a low power rating, the amount of working fluid required may be so small that the proportionate amount of vapor can be released directly into the missile compartment without causing any damage to the electronic components.

A typical pellet 26 would be 0.05 inch in diameter and approximately 0.10 inch long and melt rapidly due to the small mass and travel distance when at the melt temperature. A pellet could be made of wax or any other material that melts at a specific temperature. The use of metal within the pellet material enhances the heat conduction process. There are numerous paraffins which melt at prescribed temperatures between 85° C. and 90° C. For a listing of potential materials, see A Design Handbook for Phase Change Thermal Control and Energy Storage Devices, W. R. Humphries and Edwin I. Griggs, NASA Technical Papers 1074, November 1977. A listing of potential metals which melt at prescribed temperatures are listed in Engineering Material Handbook, edited by C. Mantell, McGraw Hill Co. 1954. For the temperatures that this invention will probably encounter, the preferred pellet material is probably a paraffin.

Requirements such as the size and shape of the heat sink plate 12, cavity 14, cover 16, plug 30, passage 32 in the plug 30 and the amount and type of working fluid filled in the wick 20 are all functions of the particular desired temperature, flight time, heat dissipation of the electronic component 11 and heat produced by other factors such as air friction at the missile skin. The appropriate materials and amounts must be determined based on the particular application and can be readily accomplished by a person skilled in the art.

The following calculations show the effectiveness of the invention. The calculations are for an electronic component 11 dissipating 25 Watts during a flight time of seven minutes. It is assumed that there is excellent thermal coupling between the invention and the missile skin. For a carriage flight worst case scenario, where it is assumed that the missile skin reaches a temperature of 85° C.:

$T_j$ = Electronic component junction temperature
$\Delta T_{j-s}$ = 25° C. = Assumed change in temperature between the missile skin and the electronic component junction
$R_{j-s}$ = Resistance from electronic component junction to the missile skin = $\Delta T_{j-s}/Q$ = 25° C./25 Watts = 1.0° C./Watt
Q = Heat produced in Watts
$T_s$ = Temperature of missile skin $$T_j = R_{j-s} \cdot Q + T_s = (1° \text{ C./Watt})(25 \text{ Watts}) + 85° \text{ C.} = 110° \text{ C.}$$

$T_j$ is 110° C. in this worst case scenario. In effect, the electronic component junction temperature will be 110° C. when the missile skin is 85° C. Since 110° C. is at the maximum electronic component junction temperature, the electronic component 11 would not require enhanced cooling. The plug 30 could remain sealed and no vapor would have to be released. This is the ideal situation, since the pellet 26 will not have to be melted. While the electronic component 11 can handle this temperature, any additional heat would have to be removed. Otherwise the electronic component 11 could be destroyed by the excess heat.

During missile flight, the electronic component 11 could be exposed to such excess heat. Assuming that the skin temperature rises an average of 100° C. above the worst case in-carriage flight condition (computed above) during the 7 minute flight, the total heat affecting the electronic component junction could be calculated as follows:

$Q^L = \Delta T_{s-j}/R_{j-s}$ = Heat generated from the missile skin that reaches the electronic component
$Q_T$ = Total heat affecting the electronic component
$Q_T = Q_L$ + heat generated by the electrical component
$Q_T = (185° \text{ C.} - 85° \text{ C.})/(1.0° \text{ C./Watt}) + 25 \text{ Watts} = 125 \text{ Watts}$ To maintain the electronic component 11 at or below the upper operating limit of 110° C., 0.050 lb of water is required to handle the 125 Watts. The combined wick and water thickness is approximately 0.14 inches on a 20 square inch surface, assuming a 50% volume efficiency of the wire mesh (that is, the wire mesh occupies 50% of the surface area).

It is understood that the above-described embodiment is merely illustrative of the possible specific embodiments which may represent principles of the present invention. Other arrangements may readily be devised in accordance with these principles by those skilled in the art without departing from the scope of the invention.

What is claimed as new and desired to be secured by Letters Patent of the United States is:

1. A cooling device for at least one electronic component comprising:
   a heat sink enclosure having an interior cavity and a release opening joining the interior cavity to an area external of said enclosure;
   a wick bonded to the inside surface of the interior cavity of said enclosure;
   a meltable pellet inserted into the release opening of said enclosure;
   a working fluid, said working fluid being sealed inside the interior cavity of said enclosure and permeating said wick;
   said enclosure mounted in thermal contact with said at least one electronic component;
   whereby upon melting of said pellet, a vapor of said working fluid travels through said release opening acting to cool to said enclosure and said at least one electronic component.

2. An electronic component cooling device as in claim 1 wherein said enclosure further comprises:
   a heat sink plate; and
   a cover bonded to said heat sink plate.

3. An electronic component cooling device as in claim 1 further comprising a electronic component bonded in thermal contact with an exterior wall of said heat sink enclosure adjacent to said wick.

4. The cooling device of claim 3 wherein said meltable pellet is made of a mixture of metal and wax.

5. The cooling device of claim 4 wherein said meltable pellet is made from a material that melts at a temperature above the maximum steady state temperature but at or below the upper temperature limit of the electronic component.

6. A cooling device as set forth in claim 3 wherein said at least one electronic component is randomly oriented.

7. A cooling device as set forth in claim 6 wherein the enclosure further comprises:
a separate light-weight compact enclosure in thermal contact with each of said at least one electronic component.

8. An electronic component cooling device as in claim 1 wherein said meltable pellet is made of metal.

9. An electronic component cooling device as in claim 1 wherein said meltable pellet is made of a paraffin.

10. A cooling device as set forth in claim 1 wherein the meltable pellet is typically longer than it is in diameter and the pellet is located such that the thermal travel distance from the electronic component is short.

11. A cooling device for at least one electronic component comprising:
a heat sink enclosure having an interior cavity and a release opening joining the interior cavity to an area external of said enclosure;
a wick bonded to the inside surface of the interior cavity of said enclosure;
a plug retained in the release opening in said enclosure, said plug having a passage leading from the interior cavity of said enclosure to said area external of said enclosure;
a meltable pellet inserted into the passage of said plug;
a working fluid, said working fluid being sealed inside the interior cavity of said enclosure and permeating said wick;
said at least one electronic component mounted in thermal communication with said enclosure;
whereby upon melting of said pellet, a vapor of said working fluid travels through said passage acting to cool said enclosure and at least one electronic component.

12. An electronic component cooling device as in claim 11 wherein said enclosure further comprises:
a heat sink plate; and
a cover bonded to said heat sink plate.

13. An electronic component cooling device as in claim 11 further comprising a electronic component bonded in thermal contact with an exterior wall of said heat sink enclosure adjacent to said wick.

14. The cooling device of claim 13 wherein said meltable pellet is made of a mixture of metal and wax.

15. The cooling device of claim 14 wherein said meltable pellet is made from a material that melts at a temperature above the maximum steady state temperature but at or below the upper temperature limit of the electronic component.

16. An electronic component cooling device as in claim 11 wherein said meltable pellet is made of metal.

17. An electronic component cooling device as in claim 11 wherein said meltable pellet is made of a paraffin.

18. A method of cooling at least one randomly-oriented electronic component during a missile flight comprising:
providing a separate light-weight compact randomly-oriented captive means attached to each of said at least one randomly-oriented electronic components for captively positioning a working fluid in communication with that component;
captively vaporizing said working fluid within the separate captive means during the operation of its corresponding component;
said separate captive means including a temperature sensitive means for controlling the release of the vapors contained within said captive means when the corresponding component reaches a predetermined temperature during routine operation;
thereby preventing destruction from excess heat of said at least one electronic component during the flight of the missile.

19. The method of claim 18 where the means for captively positioning a working fluid in communication with each component includes a wick placed inside each separate captive means and immediately adjacent to its corresponding component.

20. The method of claim 18 wherein the temperature sensitive means for controlling the release of the vapors contained within said captive means includes an appropriately-sized passage and a meltable pellet.

* * * * *